(12) United States Patent
Le Tual et al.

(10) Patent No.: US 9,000,964 B2
(45) Date of Patent: Apr. 7, 2015

(54) CIRCUIT AND METHOD FOR SIGNAL CONVERSION

(71) Applicants: STMicroelectronics SA, Montrouge (FR); STMicroelectronics International N.V., Amsterdam (NL)

(72) Inventors: Stéphane Le Tual, Saint Egreve (FR); Pratap Narayan Singh, Chahania Chandauli (IN)

(73) Assignees: STMicroelectronics SA, Montrouge (FR); STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/294,300

(22) Filed: Jun. 3, 2014

(65) Prior Publication Data

US 2014/0361915 A1      Dec. 11, 2014

(30) Foreign Application Priority Data

Jun. 7, 2013   (FR) ..................................... 13 55251

(51) Int. Cl.

| H03M 1/00 | (2006.01) |
|---|---|
| H03M 1/08 | (2006.01) |
| H03K 3/013 | (2006.01) |
| G11C 27/02 | (2006.01) |
| H03K 19/0185 | (2006.01) |

(52) U.S. Cl.
CPC ................. *H03M 1/08* (2013.01); *H03K 3/013* (2013.01); *G11C 27/026* (2013.01); *H03K 19/018528* (2013.01)

(58) Field of Classification Search
CPC ....................................................... H03M 1/124
USPC ............ 341/155, 156, 122; 330/255; 327/175
See application file for complete search history.

(56) References Cited

U.S. PATENT DOCUMENTS

| 5,635,934 A * | 6/1997 | Brown ........................... 341/118 |
| 6,420,931 B1 * | 7/2002 | Maida ............................ 330/255 |
| 7,288,994 B2 * | 10/2007 | Copani et al. .................. 330/301 |
| 7,888,994 B2 * | 2/2011 | Zamprogno et al. .......... 327/563 |

(Continued)

FOREIGN PATENT DOCUMENTS

| JP | H05 122033 A | 5/1993 |
| WO | 2009/034518 A2 | 3/2009 |

*Primary Examiner* — Brian Young
(74) *Attorney, Agent, or Firm* — Allen, Dyer, Doppelt, Milbrath & Gilchrist, P.A.

(57) ABSTRACT

The invention concerns a circuit comprising: a first transistor (202) having a first main current node coupled to a first voltage signal ($CN_{VDD}$), a control node coupled to a second voltage signal ($CP_{VDD}$) and a second main current node coupled to an output node (206) of the circuit; a second transistor (204) having a first main current node coupled to a third voltage signal ($CN_{GND}$), a control node coupled to a fourth voltage signal ($CP_{GND}$) and a second main current node coupled to said output node of the circuit; and circuitry (210, 212) adapted to generate said first, second, third and fourth voltage signals based on a pair of differential input signals (CP, CN), wherein said first and second voltage signals are both referenced to a first supply voltage (VDD) and wherein said third and fourth voltage signals are both referenced to a second supply voltage (GND).

14 Claims, 3 Drawing Sheets

(56) References Cited

U.S. PATENT DOCUMENTS

| | | | |
|---|---|---|---|
| 8,085,067 B1* | 12/2011 | Stiff .............................. 327/51 | |
| 2002/0036576 A1 | 3/2002 | Saito | |
| 2003/0128065 A1 | 7/2003 | Naujokat | |
| 2010/0176868 A1 | 7/2010 | Louwsma et al. | |
| 2011/0050287 A1 | 3/2011 | Glass | |

* cited by examiner

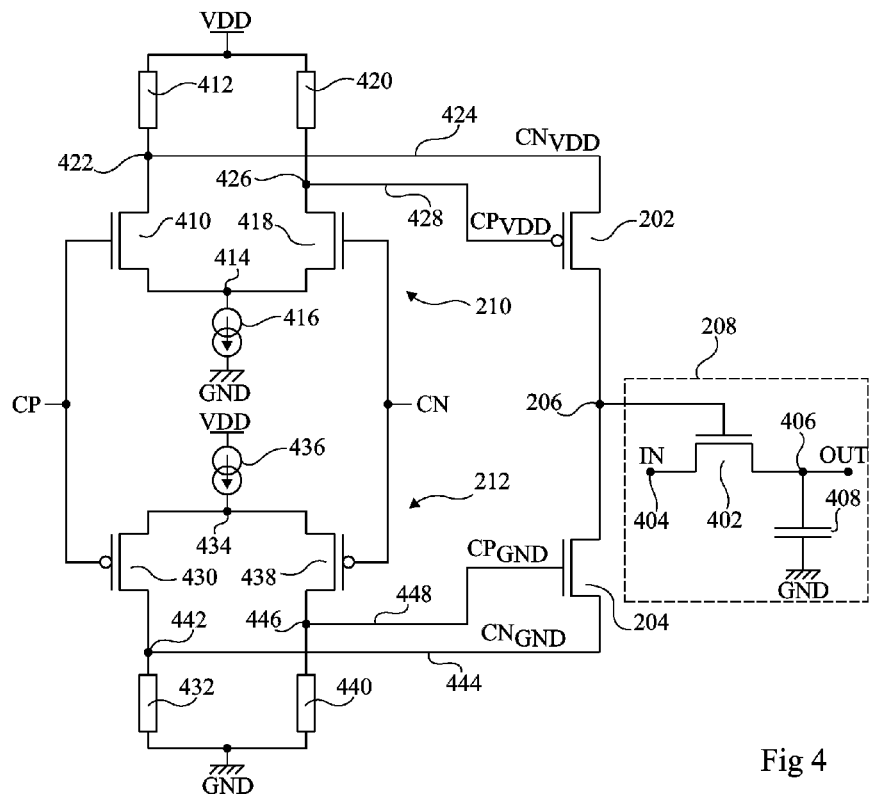
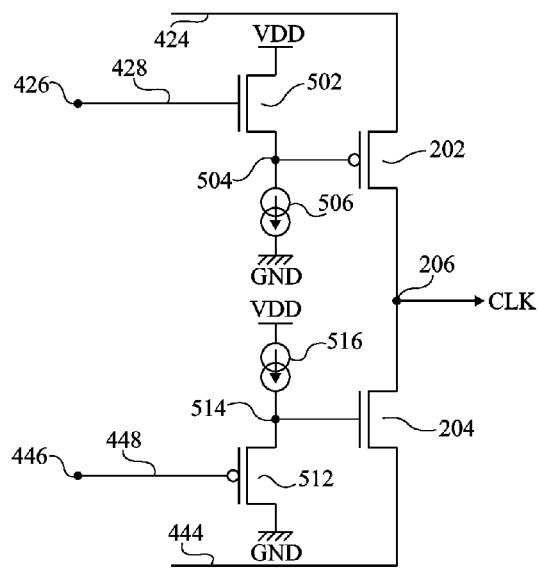
Fig 4
Fig 5

CIRCUIT AND METHOD FOR SIGNAL CONVERSION

CROSS REFERENCE TO RELATED APPLICATION

This application claims the priority benefit of French Patent Application number 13/55251, filed on Jun. 7, 2013, entitled "Circuit et procédé conversion de signal", the contents of which is hereby incorporated by reference in its entirety to the maximum extent allowable by law.

FIELD

The present application relates to a circuit and method for performing signal conversion, and in particular to a circuit and method for converting low voltage differential signals into a single-ended output signal.

BACKGROUND

In the fields of signal sampling and other high frequency applications, timing signals of up to 10 GHz or more are often used to control switches or other circuit elements.

One example is sampling circuitry, such as a track and hold circuit of an analog to digital converter (ADC). In such an ADC, the track and hold circuit is controlled by a clock signal to store an input signal at a given time instant. In some embodiments, the timing signal is generated by converting low noise differential signals, for example provided by CML (current mode logic). Indeed, low noise differential transmission is often the preferred solution for transmitting high frequency timing signals across an integrated circuit. The generation of the timing signal based on the low voltage differential signal usually involves amplifying the signal to generate a single-ended signal having a voltage swing corresponding to the transistor technology used in the switches of the receive circuit.

However, a problem is that existing solutions for converting such differential signals into a single-ended full-swing signal tend to add jitter to the timing signal. There is thus a need in the art for an improved conversion circuit.

SUMMARY

It is an aim of embodiments of the present disclosure to at least partially address one or more needs in the prior art.

According to one aspect, there is provided a circuit comprising: a first transistor having a first main current node coupled to a first voltage signal, a control node coupled to a second voltage signal and a second main current node coupled to an output node of the circuit; a second transistor having a first main current node coupled to a third voltage signal, a control node coupled to a fourth voltage signal and a second main current node coupled to said output node of the circuit; and circuitry adapted to generate said first, second, third and fourth voltage signals based on a pair of differential input signals, wherein said first and second voltage signals are both referenced to a first supply voltage and wherein said third and fourth voltage signals are both referenced to a second supply voltage.

According to one embodiment, the circuitry is adapted to: generate said first voltage signal by offsetting said first supply voltage by an amount determined by relative levels of first and second signals of said pair of differential signals; generate said second voltage signal by offsetting said first supply voltage by an amount determined by the relative levels of said first and second signals; generate said third voltage signal by offsetting said second supply voltage by an amount determined by the relative levels of said first and second signals; and generate said fourth voltage signal by offsetting said second supply voltage by an amount determined by the relative levels of said first and second signals.

According to one embodiment, the circuitry comprises: a first branch generating said first voltage signal and comprising a resistor coupled to said first supply voltage and in series with a transistor controlled by said first signal; a second branch generating said second voltage signal and comprising a resistor coupled to said first supply voltage and in series with a transistor controlled by said second signal; a third branch generating said third voltage signal and comprising a resistor coupled to said second supply voltage and in series with a transistor controlled by said first signal; and a fourth branch generating said fourth voltage signal and comprising a resistor coupled to said second supply voltage and in series with a transistor controlled by said second signal.

According to one embodiment, the circuitry further comprises: a third transistor coupled between said first supply voltage and the control node of said first transistor, a control node of said third transistor being coupled to a node between the resistor and transistor of said second branch; and a fourth transistor coupled between said second supply voltage and the control node of said second transistor, a control node of said fourth transistor being coupled to a node between the resistor and transistor of said fourth branch.

According to one embodiment, each signal of the pair of differential input signals has a voltage swing of less than 0.6 V.

According to one embodiment, each signal of the pair of differential input signals has a first voltage swing, and an output signal generated at said output node has a second voltage swing higher than said first voltage swing.

According to one embodiment, the output node is coupled to a control node of a fifth transistor.

According to one embodiment, the circuit further comprises a track and hold circuit comprising: said fifth transistor coupled between an input node and an output node of the track and hold circuit; and a capacitor coupled to the output node of the track and hold circuit.

According to one embodiment, the fifth transistor is a MOS transistor.

According to one embodiment, the first transistor is a p-channel MOS transistor, and the second transistor is an n-channel MOS transistor.

According to a further embodiment, there is provided an analog to digital converter comprising the above circuit.

According to a further embodiment, there is provided a method of conversion of a pair of differential input signals by a circuit, the method comprising: generating first, second, third and fourth voltage signals based on said pair of differential input signals, wherein said first and second voltage signals are both referenced to a first supply voltage and wherein said third and fourth voltage signals are both referenced to a second supply voltage; applying said first voltage signal to a first main current node of a first transistor and said second voltage signal to a control node of said first transistor, wherein a second main current node of said first transistor is coupled to an output node of the circuit; and applying said third voltage signal to a first main current node of a second transistor and a fourth voltage signal to a control node of said second transistor, wherein a second main current node of said second transistor is coupled to said output node of the circuit.

BRIEF DESCRIPTION OF THE DRAWINGS

The foregoing and other features and benefits will become apparent from the following detailed description of embodiments, given by way of illustration and not limitation with reference to the accompanying drawings, in which:

FIG. 4 illustrates the circuit of FIG. 2 in more detail according to an example embodiment;

FIG. 5 illustrates a variant of the circuit of FIG. 4 according to an example embodiment;

DETAILED DESCRIPTION

The term "full-swing signal" is used herein to mean that the highest and lowest levels of the signal are appropriate for activating and deactivating transistors receiving the signal. For example, the high level corresponds to the supply voltage VDD of the circuit and the low level corresponds to the ground voltage GND of the circuit, each with a tolerance equal to +/−10 percent of the supply voltage VDD.

Figure 1:
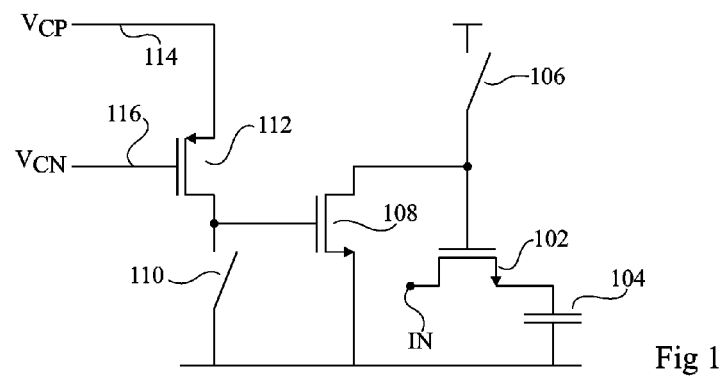
FIG. 1 represents a circuit for converting differential signals into a full-swing single-ended signal.

FIG. 1 substantially reproduces the circuit represented in FIG. 5 of US patent application US2010/0176868. A track and hold circuit comprises an NMOS transistor 102 having its drain coupled to an input signal IN, and its source coupled to ground via a capacitor 104. The gate of transistor 102 is coupled to a supply voltage via a switch 106, and also to ground via an NMOS transistor 108. The gate of transistor 108 is further coupled to ground via a switch 110, and to the drain of a PMOS transistor 112. The source of transistor 112 is coupled to a node 114 receiving an alternating voltage $V_{CP}$. The gate of transistor 112 is coupled to a node 116 receiving an alternating voltage $V_{CN}$. The voltages $V_{CP}$ and $V_{CN}$ are differential signals.

In operation, during a track phase, the switch 106 is conducting, such that the gate of transistor 102 is coupled to the supply voltage. Furthermore, the switch 110 is conducting, such that transistor 108 is non-conducting, and the signals $V_{CP}$ and $V_{CN}$ are for example low and high respectively, such that transistor 112 is non-conducting.

At the start of a hold phase, the switches 106 and 110 are opened. Furthermore, the signals $V_{CP}$ and $V_{CN}$ inverse, $V_{CP}$ becoming high and $V_{CN}$ going low, such that transistor 112 becomes conducting. Thus transistor 108 is activated, pulling down the voltage at the gate of transistor 102, and thereby isolating the capacitor 104 from the input signal IN.

While the transistor 112 of FIG. 1 is to some extent protected from noise on the supply voltage, a disadvantage of the circuit of FIG. 1 is that the source node of transistor 108 is not protected and will collect ground noise, leading to the presence of noise at the gate of transistor 102. Furthermore, when a high state is to be applied to the gate of transistor 102, the gate of transistor 102 is connected directly to the supply voltage via switch 106, and is therefore not protected from noise on this supply voltage.

The presence of such noise at the gate of transistor 102 will alter its gate source voltage, and affect the sampling time applied by the transistor 102. Any change in this sampling time is very undesirable as the input signal sampled by the track and hold circuit will no longer be sampled at the correct time instant.

Figure 2:
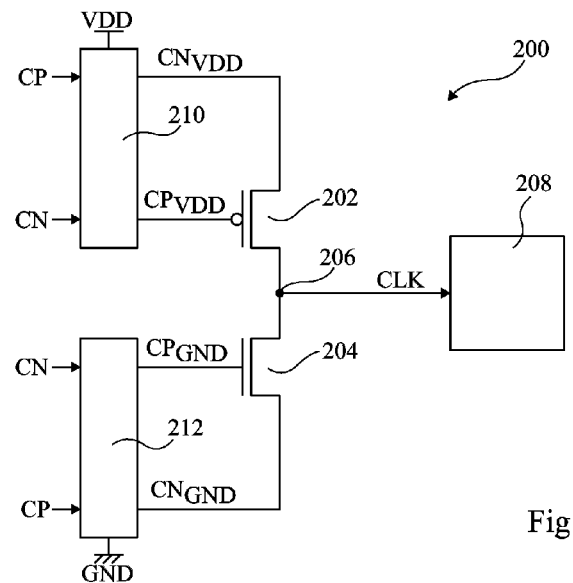
FIG. 2 schematically illustrates a circuit according to an embodiment of the present disclosure.

FIG. 2 illustrates a circuit 200 according to an example embodiment of the present disclosure. As will be described in more detail below, circuit 200 converts a pair of differential input signals CP, CN into a single-ended timing signal CLK, and in particular converts a voltage swing of each of the differential signals, which is for example relatively low, into a voltage swing adapted to the transistors to be controlled.

For example, the differential signals CP, CN are low noise signals each having a voltage swing equal to 0.6 V or less. A typical voltage swing of these signals would be around 0.4 V, but in some cases it could be as low as 0.15 V. Such signals are for example provided by CML (current mode logic) elements, which enable high frequency signals, for example of up to 10 GHz or more, to be transmitted across an integrated circuit.

The circuit 200 comprises a transistor 202, which is for example a PMOS transistor, coupled in series with a further transistor 204, which is for example an NMOS transistor. Transistors 202 and 204 each for example have one of their main current nodes, for example their drains, coupled together to an output node 206. The other main current node of transistor 202, for example its source, is coupled to receive a voltage signal $CN_{VDD}$. The control node of transistor 202 is coupled to receive a voltage signal $CP_{VDD}$. The other main current node of transistor 204, for example its source, is coupled to receive a voltage signal $CN_{GND}$. The control node of transistor 204 is coupled to receive a voltage signal $CP_{GND}$.

The output node 206 provides an output timing signal CLK to a further circuit block 208. The signal CLK for example has a voltage swing substantially equal to the one between the supply voltage VDD and ground, the swing being for example of between 0.5 V and 2.5 V.

The circuit block 208 for example comprises a track and hold circuit, a mixer, or other circuitry under the control of the timing signal CLK.

The voltage signals $CN_{VDD}$ and $CP_{VDD}$ are generated by circuitry 210 based on differential input signals CP and CN, and are referenced to the supply voltage VDD. For example, the signal $CN_{VDD}$ is generated by offsetting the supply voltage VDD by an amount based on the signals CP and CN, and the signals $CP_{VDD}$ is generated by offsetting the supply voltage VDD by an amount based on the signals CP and CN. For example, the signals $CN_{VDD}$ and $CP_{VDD}$ are each offset from the supply voltage VDD by an amount based on the relative levels of the signals CP and CN. As will be described in more detail below, a gain is also for example applied when generating the signals $CN_{VDD}$ and $CP_{VDD}$.

The voltage signals $CN_{GND}$ and $CP_{GND}$ are generated by circuitry 212 based on the differential input signals CP and CN, and are referenced to the ground voltage GND. For example, the signal $CN_{GND}$ is generated by offsetting the ground voltage GND by an amount based on the signals CP and CN, and the signals $CP_{GND}$ is generated by offsetting the ground voltage GND by an amount based on the signals CP and CN. For example, the signals $CN_{GND}$ and $CP_{GND}$ are each offset from the ground voltage GND by an amount based on the relative levels of the signals CP and CN. As will be described in more detail below, a gain is also for example applied when generating the signals $CN_{GND}$ and $CP_{GND}$.

Operation of the circuitry of FIG. 2 will now be described in more detail with reference to the timing diagram of FIG. 3.

Figure 3:
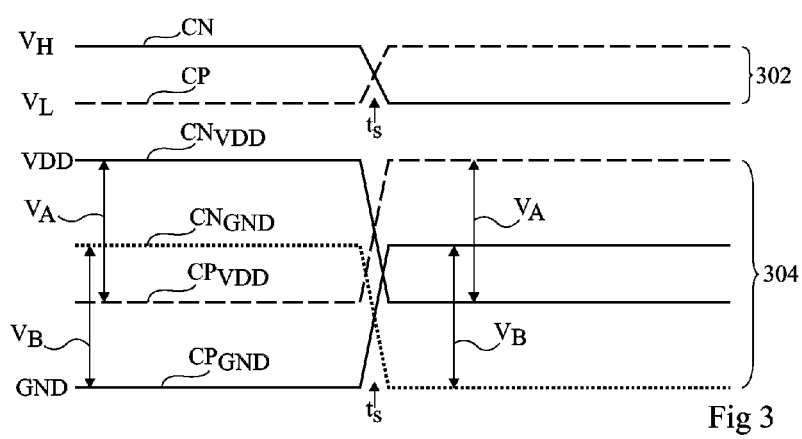
FIG. 3 is a timing diagram showing signals in the embodiment of FIG. 2 according to an example embodiment.

FIG. 3 illustrates a timing diagram 302 representing an example of the signals CN (shown by a solid line) and CP (shown by a dashed line). In the example of FIG. 3, the signal CN is initially at a high level $V_H$, while the signal CP is at a low level $V_L$. At a sampling time $t_S$, the signal CN goes from the level $V_H$ to the level $V_L$, the signal CP goes from the level $V_L$ to the level $V_H$. The difference between the levels $V_L$ and $V_H$ corresponds to the voltage swing of each of the differential input signals CP and CN. The common mode value of these signals is for example at a level halfway between the supply voltage VDD and ground voltage, for example at VDD/2.

FIG. 3 illustrates a further timing diagram 304 showing examples of the signals $CN_{VDD}$, $CN_{GND}$, $CP_{VDD}$ and $CP_{GND}$.

While the signal CN is high and the signal CP low, the signal $CN_{VDD}$ is for example at or close to the supply voltage VDD, and the signal $CP_{GND}$ is for example at or close to the ground voltage. The signal $CP_{VDD}$ is offset with respect to the supply voltage $V_{DD}$ by an offset value $V_A$. Similarly, the signal $CN_{GND}$ is offset with respect to the ground voltage GND by an offset value $V_B$.

At the sampling time $t_s$ when the signal CN goes low and the signal CP goes high, the signal $CP_{VDD}$ changes to a level at or close to the supply voltage VDD, and the signal $CN_{GND}$ changes to a value at or close to the ground voltage GND. The signal $CN_{VDD}$ changes to a level offset with respect to the supply voltage $V_{DD}$ by the offset value $V_A$. Similarly, the signal $CP_{GND}$ changes to a level offset with respect to the ground voltage GND by the offset value $V_B$.

Thus, while the signal CP is low and the signal CN is high, the transistor 202 will see a gate source voltage $V_{GS}$ of $-V_A$, and will therefore be conducting. The transistor 204 on the other hand will see a $V_{GS}$ voltage of $-V_B$, and will thus be non-conducting. The voltage at the output node 206 will therefore be at substantially the level of $CN_{VDD}$, in other words at substantially the supply voltage VDD.

While the signal CP is high and the signal CN is low, the transistor 202 will see a $V_{GS}$ voltage of $V_A$, and with therefore be non-conducting. The transistor 204 on the other hand will see a $V_{GS}$ voltage of $V_B$, and will thus be conducting. Thus the voltage at the output node 206 will be at substantially the level of $CN_{GND}$, in other words at substantially the ground voltage GND.

Each of the offset values $V_A$ and $V_B$ is for example equal to between 0.4 V and 0.6 V.

FIG. 4 illustrates the circuit of FIG. 2 in more detail according to an example embodiment.

In the example of FIG. 4, the circuit block 208 is a track and hold circuit comprising a transistor 402, which is for example an NMOS transistor, coupled between an input node 404 and an output node 406. The output node 406 is coupled to ground via a capacitor 408. The control node of transistor 402 is coupled to the output node 206 between transistors 202 and 204.

FIG. 4 also illustrates an example of the circuitry 210 and 212.

The circuitry 210 comprises a branch having a transistor 410, for example an NMOS transistor, and a resistor 412 coupled in series between a node 414 and the supply voltage VDD. The node 414 is in turn coupled to ground via a current source 416. The circuitry 210 further comprises another branch having a transistor 418, for example an NMOS transistor, and a resistor 420 coupled in series between node 414 and the supply voltage VDD. The control node of transistor 410 is coupled to receive the input signal CP, and the control node of transistor 418 is coupled to receive the input signal CN. A node 422 between the transistor 410 and the resistor 412 is coupled via a line 424 to the source of transistor 202 to provide the voltage signal $CN_{VDD}$. A node 426 between the transistor 418 and the resistor 420 is coupled via a line 428 to the control node of transistor 202 to provide the voltage signal $CP_{VDD}$.

The circuitry 212 comprises a branch having a transistor 430, for example a PMOS transistor, and a resistor 432 coupled in series between a node 434 and the ground voltage GND. The node 434 is in turn coupled to the supply voltage VDD via a current source 436. The circuitry 212 further comprises another branch having a transistor 438, for example a PMOS transistor, and a resistor 440 coupled in series between node 434 and the ground voltage GND. The control node of transistor 430 is coupled to receive the input signal CP, and the control node of transistor 438 is coupled to receive the input signal CN. A node 442 between the transistor 430 and the resistor 432 is coupled via a line 444 to the source of transistor 204 to provide the voltage signal $CN_{GND}$. A node 446 between the transistor 438 and the resistor 440 is coupled via a line 448 to the control node of transistor 204 to provide the voltage signal $CP_{GND}$.

In operation, while the input signal CP is low and the input signal CN is high, a relatively high proportion of the current of the current source 416 will be directed through the resistor 420, and a relatively low proportion of the current of the current source 416 will be directed through the resistor 412. Similarly, a relatively high proportion of the current of the current source 436 will be directed through the resistor 432, and a relatively low proportion of the current of the current source 436 will be directed through the resistor 440. Therefore, the voltage signal $CN_{VDD}$ will be at substantially the supply voltage level VDD and the voltage signal $CP_{GND}$ will be at substantially the ground voltage level. The voltage at node 426 will however be equal to the supply voltage VDD minus the voltage drop across the resistor 420. Assuming that resistor 420 has a resistance R, the voltage at node 426 will therefore be equal to $VDD-RI_A$, where $I_A$ is the current flowing through transistor 418 as a function of the current of current source 416 and the relative levels of the differential signals CP, CN. Similarly, the voltage at node 442 will be equal to the ground voltage GND plus the voltage drop across the resistor 432. Assuming that resistor 432 also has a resistance R, the voltage at node 442 will therefore be equal to $GND+RI_B$, where $I_B$ is the current flowing through transistor 430 as a function of the current of current source 436 and the relative levels of the differential signals CP, CN.

While the input signal CP is high and the input signal CN is low, a relatively high proportion of the current of the current source 416 will be directed through the resistor 412, and a relatively low proportion of the current of the current source 416 will be directed through resistor 420. Similarly, a relatively high proportion of the current of the current source 436 will be directed through the resistor 440, and a relatively low proportion of the current of the current source 436 will be directed through the resistor 432. Therefore, the voltage signal $CP_{VDD}$ will be at substantially the supply voltage level VDD and the voltage signal $CN_{GND}$ will be at substantially the ground voltage level. The voltage at node 422 will however be equal to the supply voltage VDD minus the voltage drop across the resistor 412. Assuming that resistor 412 has a resistance R, the voltage at node 422 will therefore be equal to $VDD-RI_A$, where $I_A$ is now the current flowing through transistor 410 as a function of the current of current source 416 and the relative levels of the differential signals CP, CN. Similarly, the voltage at node 446 will be equal to the ground voltage GND plus the voltage drop across the resistor 440. Assuming that resistor 440 also has a resistance R, the voltage at node 446 will therefore be equal to $GND+RI_B$, where $I_B$ is now the current flowing through transistor 438 as a function of the current of current source 436 and the relative levels of the differential signals CP, CN.

As it will be apparent to those skilled in the art, the level of current provided by the current sources 416, 436, and the resistance values of resistors 412, 420, 432 and 440 can be chosen to provide a differential gain of the differential signals $CP_{VDD}$, $CN_{VDD}$ and $CP_{GND}$, $CN_{GND}$ with respect to the differential signals CP, CN.

For example, the resistance value R of each of the resistors 412, 420, 432 and 440 is in the range 100 to 1 k ohms.

FIG. 5 illustrates part of the circuit of FIG. 4, and illustrates a variation that can be applied.

As illustrated, rather than the line 428 of FIG. 4 being coupled directly to the control node of transistor 202, it is coupled to the control node of a transistor 502, for example an NMOS transistor, which is coupled by its main current nodes between the supply voltage VDD and a node 504 coupled to the control node of transistor 202. Node 504 is for example further coupled to ground via a current source 506.

Similarly, rather than the line 448 of FIG. 4 being coupled directly to the control node of transistor 204, it is coupled to the control node of a transistor 512, for example a PMOS transistor, which is coupled by its main current nodes between the ground voltage GND and a node 514 coupled to the control node of transistor 204. Node 514 is further coupled to the supply voltage VDD via a current source 516.

The transistors 502 and 512 have the effect of shifting the corresponding voltage levels $CP_{VDD}$ and $CP_{GND}$ by the gate source voltages $V_{GS}$ of these transistors, as will now be described in more detail with reference to the timing diagram of FIG. 6.

Figure 6:
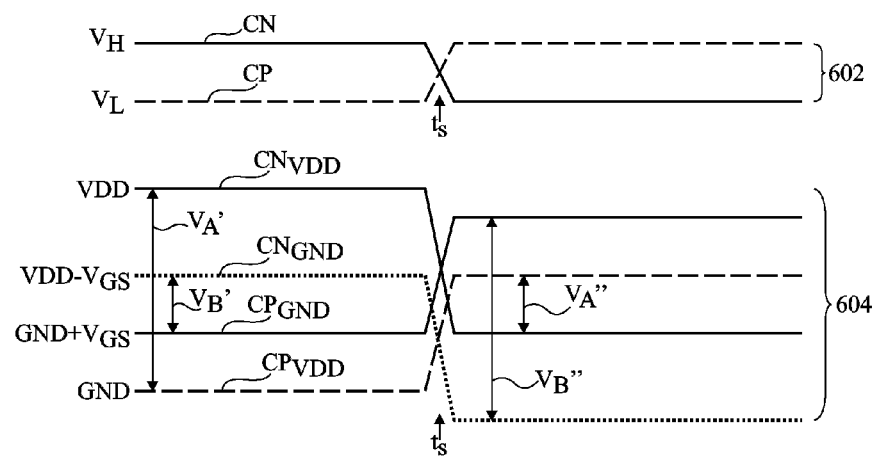
FIG. 6 is a timing diagram showing signals in the circuit of FIG. 5 according to an example of embodiment.

FIG. 6 shows a timing diagram 602 with examples of the signals CP and CN, which is the same example as the one in FIG. 3 and will not be described again.

FIG. 6 also shows a timing diagram 604 illustrating the corresponding signals $CN_{VDD}$, $CN_{GND}$, $CP_{GND}$ and $CP_{VDD}$. As illustrated, with respect to the timing diagram 304 in FIG. 3, the signal $CP_{VDD}$ is shifted by the gate source voltage $V_{GS}$ of transistor 502, leading to an increased in the gate source voltage seen by transistor 202 to a value $V_A'=V_A+V_{GS}$ while single CP is low, and reduced to a value $V_A''=V_A-V_{GS}$ while CP is high. Furthermore, the signal $CP_{GND}$ is shifted by the gate source voltage $V_{GS}$ of transistor 512, such that the gate source voltage seen by transistor 204 is reduced to $V_B'=V_B-V_{GS}$ while CP is low, and increased to $V_B''=V_B+V_{GS}$ while CP is high.

The increased voltages $V_A'$ and $V_B''$ will ensure that transistor 202 or 204 is conducting even if the voltage swing of the voltages at nodes 422, 426 and of the voltages at nodes 442, 446 are very low. Furthermore, the speed and performance of the transistors 202, 204 will be improved. Reducing the voltages $V_B'$ and $V_A''$ is acceptable given that the $V_{GS}$ voltage of transistor 204 will still be negative or close to zero when this transistor is to be non-conducting, and the $V_{GS}$ voltage of transistor 202 will still be positive or close to zero when this transistor is to be non-conducting.

Figure 7:
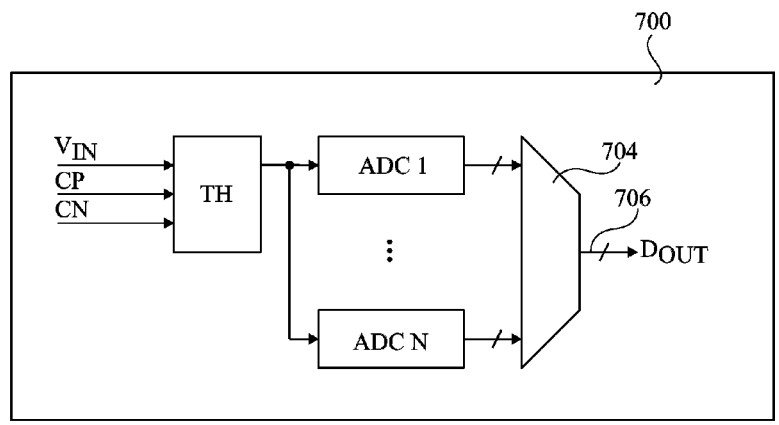
FIG. 7 illustrates a time-interleaved analog to digital converter according to an embodiment of the present disclosure.

FIG. 7 illustrates an analog-to-digital converter device 700 comprising circuitry as described in the embodiments above. In particular, the ADC device 700 comprises a track and hold circuit TH, for example comprising the circuitry of FIG. 2, 4 or 5 described above. The track and hold circuit receives an input voltage signal $V_{IN}$ to be sampled, and a pair of differential timing signals CP, CN. The output of the track and hold circuit TH is coupled to one or more analog-to-digital converter blocks ADC1 to ADCN. For example, ADC device 700 is a successive approximation ADC having a plurality of converter blocks operating in parallel on a same sampled input voltage level. The outputs of these ADC blocks are coupled to corresponding inputs of a multiplexer 704, which combines these outputs to form an n-bit data output $D_{OUT}$ on lines 706 of the ADC, where n is for example equal to 6. More generally, the digital values generated by each of the ADCs, and the data output signal $D_{OUT}$, are between 4 and 16 bits long.

An advantage of the embodiments described herein is that a pair of low voltage differential signals can be converted into a full swing single-ended signal by a simple circuit and with the addition of very little noise. Indeed, by performing the conversion by a CMOS pair, each of which receives signals referenced to one of the supply voltages at two of its three terminals, any noise present on the supply voltages will be cancelled by these transistors. Furthermore, the circuit described herein advantageously has symmetrical operation on the rising and falling edges of the differential signals, meaning that a modification of the duty cycle of the timing signal will be avoided or at least reduced.

Having thus described at least one illustrative embodiment of the invention, various alterations, modifications and improvements will readily occur to those skilled in the art.

For example, while in the circuits represented in the various figures, the high and low supply voltages are at VDD and ground, it will be apparent that any suitable voltages could be used, which may depend on the transistor technology.

Furthermore, it will be apparent to those skilled in the art that the transistors represented as p-channel MOS transistors could be replaced in alternative embodiments by re-channel MOS transistors, and vice versa. Furthermore, the various transistors could be implemented in alternative transistor technologies rather than MOS, such as bipolar.

Furthermore, it will be apparent to those skilled in the art that the various features of the embodiments described herein could be recombined, in alternative embodiments, in any combination.

The invention claimed is:

1. A circuit comprising:
    a first transistor having a first main current node coupled to a first node for receiving a first voltage signal, a control node coupled to a second node for receiving a second voltage signal, and a second main current node coupled to an output node of the circuit;
    a second transistor having a first main current node coupled to a third node for receiving a third voltage signal, a control node coupled to a fourth node for receiving a fourth voltage signal, and a second main current node coupled to said output node of the circuit; and
    circuitry configured to generate said first, second, third and fourth voltage signals based on a pair of differential input signals and to provide said first, second, third and fourth voltage signals to said first, second, third, and fourth nodes, respectively, wherein said first and second voltage signals are both referenced to a first supply voltage terminal and wherein said third and fourth voltage signals are both referenced to a second supply voltage terminal, wherein the pair of differential input signals has a voltage swing that is different from a voltage swing of an output signal generated at the output node of the circuit.

2. The circuit of claim 1, wherein said circuitry is configured to:
    generate said first voltage signal by offsetting a voltage of said first supply voltage terminal by an amount determined by relative levels of first and second differential signals of said pair of differential input signals;
    generate said second voltage signal by offsetting a voltage of said first supply voltage terminal by an amount determined by the relative levels of said first and second differential signals;

generate said third voltage signal by offsetting a voltage of said second supply voltage terminal by an amount determined by the relative levels of said first and second differential signals; and generate said fourth voltage signal by offsetting a voltage of said second supply voltage terminal by an amount determined by the relative levels of said first and second differential signals.

3. The circuit of claim 2, wherein said circuitry comprises:
a first branch generating said first voltage signal and comprising a third transistor and a first resistor coupled to said first supply voltage terminal and in series with said third transistor controlled by said first differential signal;
a second branch generating said second voltage signal and comprising a fourth transistor and a second resistor coupled to said first supply voltage terminal and in series with said fourth transistor controlled by said second differential signal;
a third branch generating said third voltage signal and comprising a fifth transistor and a third resistor coupled to said second supply voltage and in series with said fifth transistor controlled by said first differential signal; and
a fourth branch generating said fourth voltage signal and comprising a sixth transistor and a fourth resistor coupled to said second supply voltage and in series with said sixth transistor controlled by said second differential signal.

4. The circuit of claim 3, wherein said circuitry further comprises:
a seventh transistor coupled between said first supply voltage terminal and the control node of said first transistor, a control node of said seventh transistor being coupled to a node between the resistor and fourth transistor of said second branch; and
an eighth transistor coupled between said second supply voltage terminal and the control node of said second transistor, a control node of said eighth transistor being coupled to a node between the resistor and sixth transistor of said fourth branch.

5. The circuit of claim 1, wherein each differential signal of the pair of differential input signals has a voltage swing of less than 0.6 V.

6. The circuit of claim 1, wherein each differential signal of the pair of differential input signals has a first voltage swing, and wherein an output signal generated at said output node has a second voltage swing higher than said first voltage swing.

7. The circuit of claim 1, wherein said circuitry further comprises a ninth transistor having a control node and coupled to said output node.

8. The circuit of claim 7, wherein said circuitry further comprises a track and hold circuit coupled to said output node and having an input and output, wherein said ninth transistor is coupled between said input and output of the track and hold circuit; and
a capacitor coupled to the output of the track and hold circuit.

9. The circuit of claim 7, wherein said ninth transistor comprises a MOS transistor.

10. The circuit of claim 1, wherein said first transistor comprises a p-channel MOS transistor, and said second transistor comprises an n-channel MOS transistor.

11. A method of converting a pair of differential input signals by a circuit, the method comprising:
generating first, second, third and fourth voltage signals based on said pair of differential input signals, wherein said first and second voltage signals are both referenced to a first supply voltage terminal and wherein said third and fourth voltage signals are both referenced to a second supply voltage terminal;
applying said first voltage signal to a first main current node of a first transistor and said second voltage signal to a control node of said first transistor, wherein a second main current node of said first transistor is coupled to an output node of the circuit; and
applying said third voltage signal to a first main current node of a second transistor and a fourth voltage signal to a control node of said second transistor, wherein a second main current node of said second transistor is coupled to said output node of the circuit, and wherein the pair of differential input signals has a voltage swing that is different from a voltage swing of an output signal generated at the output node of the circuit.

12. The method according to claim 11, comprising generating each differential signal of the pair of differential input signals to have a voltage swing of less than 0.6 V.

13. The method according to claim 1, comprising generating each differential signal of the pair of differential input signals to have a first voltage swing, and wherein an output signal generated at said output node has a second voltage swing higher than the first voltage swing.

14. A circuit comprising:
an output node;
a first transistor comprising a p-channel MOS transistor having a first main current node coupled to a first node for receiving a first voltage signal, a control node coupled to a second node for receiving a second voltage signal, and a second main current node coupled to said output node;
a second transistor comprising an n-channel MOS transistor having a first main current node coupled to a third node for receiving a third voltage signal, a control node coupled to a fourth node for receiving a fourth voltage signal, and a second main current node coupled to said output node; and
circuitry configured to generate said first, second, third and fourth voltage signals based on a pair of differential input signals and to provide said first, second, third and fourth voltage signals to said first, second, third, and fourth nodes, respectively, wherein said first and second voltage signals are both referenced to a first supply voltage terminal and wherein said third and fourth voltage signals are both referenced to a second supply voltage terminal.

* * * * *